United States Patent

Aschwanden

[11] Patent Number: 5,999,802
[45] Date of Patent: Dec. 7, 1999

[54] DIRECT CONVERSION TUNER

[75] Inventor: Felix Aschwanden, Thalwil, Switzerland

[73] Assignee: RCA Thomson Licensing Corporation, Princeton, N.J.

[21] Appl. No.: 08/865,586

[22] PCT Filed: Jun. 6, 1994

[86] PCT No.: PCT/IB94/00138

§ 371 Date: Nov. 22, 1995

§ 102(e) Date: Nov. 22, 1995

[87] PCT Pub. No.: WO94/29948

PCT Pub. Date: Dec. 22, 1994

Related U.S. Application Data

[63] Continuation of application No. 08/553,264, filed as application No. PCT/IB94/00138, Jun. 6, 1994.

[30] Foreign Application Priority Data

Jun. 4, 1993 [GB] United Kingdom .................... 9311610
Apr. 26, 1994 [GB] United Kingdom .................... 9408211

[51] Int. Cl.$^6$ ...................................................... H04B 1/26
[52] U.S. Cl. .................................... 455/196.1; 455/226.1; 455/67.4; 455/242.2; 455/324
[58] Field of Search ................................ 455/67.1, 67.4, 455/150.1, 186.1, 196.1, 242.1, 242.2, 243.1, 265, 246, 303, 304, 306, 307, 316, 324, 338, 339, 340; 375/324, 337, 344, 349, 350; 331/25; 488/226.1

[56] References Cited

U.S. PATENT DOCUMENTS

| | | | |
|---|---|---|---|
| 4,334,323 | 6/1982 | Moore | 455/340 |
| 4,475,088 | 10/1984 | Beard | 331/25 |
| 4,926,443 | 5/1990 | Reich | 455/234.1 |
| 4,944,025 | 7/1990 | Gehring et al. | 455/207 |
| 4,953,182 | 8/1990 | Chung | 455/324 |
| 4,955,039 | 9/1990 | Rother et al. | 455/324 |
| 5,230,099 | 7/1993 | Loper | 455/324 |
| 5,371,902 | 12/1994 | Marz | 455/324 |
| 5,396,657 | 3/1995 | Jokinen | 455/339 |

FOREIGN PATENT DOCUMENTS

| | | |
|---|---|---|
| 0343273 | 11/1989 | European Pat. Off. . |
| 0496621 | 7/1992 | European Pat. Off. . |

OTHER PUBLICATIONS

Proceedings of the IRE, "A Third Method of Generation and Detection of Single–Sideband Signals", D.K. Weaver, Jr. pp. 1703–1705.

1993 IEEE, "Digital TV Receiver with a Low IF", Dietmar Ehrhardt et al, pp. 331–339.

Primary Examiner—Reinhard J. Eisenzopf
Assistant Examiner—Lester G. Kincaid
Attorney, Agent, or Firm—Joseph S. Tripoli; Peter M. Emanuel; Kuniyuki Akiyama

[57] ABSTRACT

A direct conversion tuner for tuning either analog or digital television signals includes a first and second channels, each having first and second mixers and an intervening filter stage, coupled between an RF input and an output combining unit. The first mixers receive respective first local oscillator signals which have the same frequency but a quadrature phase relationship. The frequency of the first local oscillator signals is controlled according to the selected channel so that it is located within the spectrum of the respective RF signal. The second mixers receive respective second local oscillator signals which have the same frequency but a quadrature phase relationship. The frequency of the second local oscillator signal is located above the passband of the filter stages. A digital gain and phase equalization network is included in one of the channels for adjusting the relative gain and phase shift of the two channels and is automatically controlled by a microcomputer in response to signals sampled at respective points within the first and second channels to reduce the relative gain and phase shift. As a result, near perfect cancellation of unwanted components occurs in the output combining unit.

6 Claims, 8 Drawing Sheets

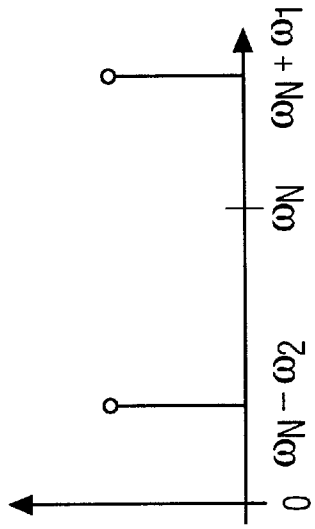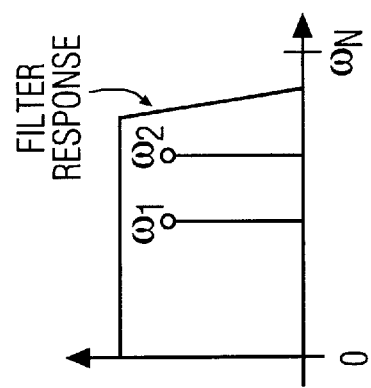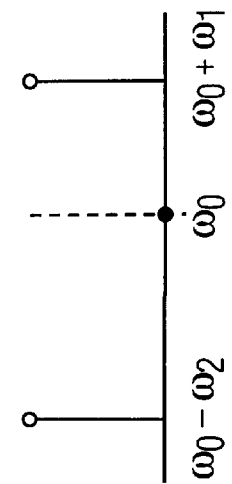

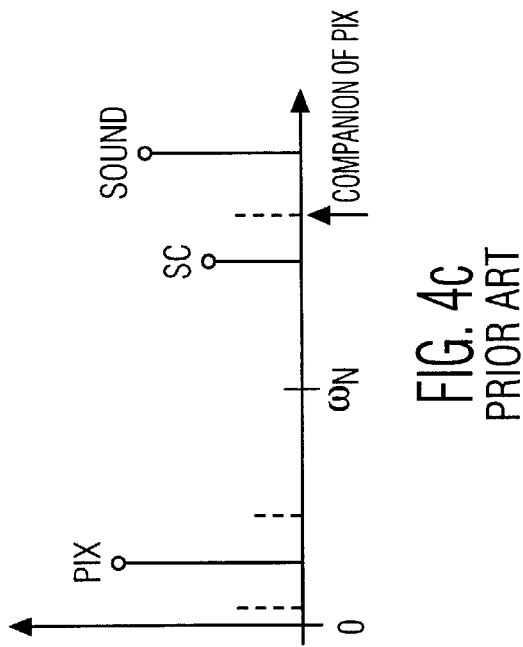
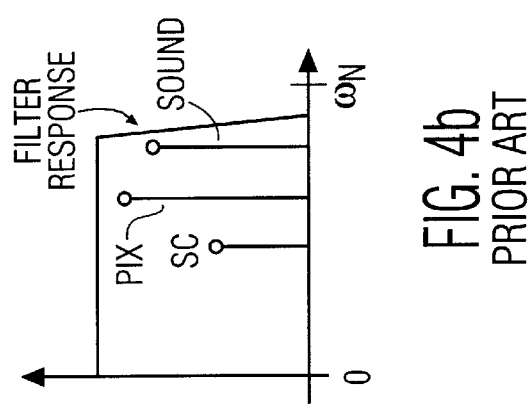
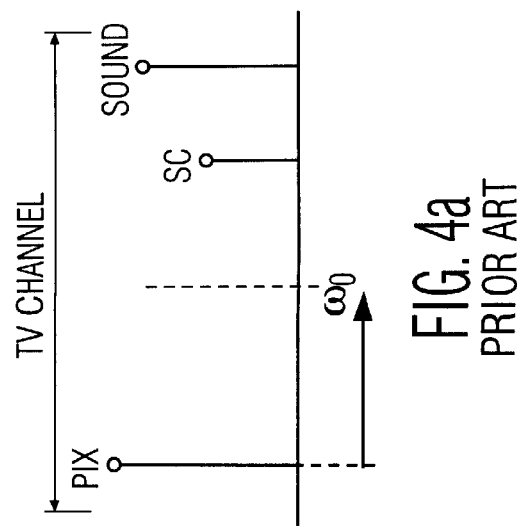

DIRECT CONVERSION TUNER

This is a continuation of application Ser. No 08/553,264, filed Nov. 22, 1995 now abandoned, which is a 371 of PCT/IB94/00138, filed Jun. 6, 1994.

FIELD OF THE INVENTION

The invention concerns a so called "direct conversion tuner" which is especially useful in a television receiver.

BACKGROUND OF THE INVENTION

An early type of tuner known as a "tuned radio frequency tuner" (TRF) included several radio frequency (RF) amplifiers which were all tuned to the frequency of the RF signal of desired transmission channel followed directly by a detection section, without an intervening mixer employed in later tuners. Such a tuner could provide relatively distortion free performance due to the absence of a mixer. However, TRF tuners tended to be large in size and subject to stability and gain control problems due to the number RF amplifiers which were needed. Moreover, TRF tuners did not provide a consistent or adequate degree of signal selectivity.

The type of tuner which is primarily used today is known as a "heterodyne" or "superheterodyne" tuner. In its simplest form, known as a "single-conversion" tuner, it comprises a tunable RF amplifier followed by a frequency conversion stage, including a mixer and a local oscillator. The frequency conversion stage produces an intermediate frequency (IF) signal which corresponds to the received RF signal but has a lower frequency. The IF signal is filtered by an IF filter section and the resultant signal is coupled to a detection section. The combination of conversion stage and the following IF filter section provides a significantly better selectivity characteristic than a TRF tuner. The frequency of the local oscillator signal is offset (usually higher) from the frequency of the desired RF signal by the desired frequency of the IF signal. In a television receiver, the local oscillator signal is controlled so that it places the frequency of the IF picture carrier corresponding to the RF picture carrier at a nominal frequency, for example, at 45.75 MHz in the United States and 38.9 MHz in Europe.

A single conversion tuner can be made quite small and relatively inexpensive. However, it produces unwanted intermodulation and cross-modulation products due to third and higher order components of the signal transfer characteristics of the mixer included in the frequency conversion stage. Various unwanted conversion products, known in the tuner fields as "image", "one-half IF" and "IF beats", continue to be a problem. The IF filter is designed to minimize unwanted conversion products and also to provide rejection of responses due to adjacent channels (selectivity). Thus, the selection of the IF frequency is a compromise. As a result the rejection of unwanted conversion products and selectivity of the tuner may not be adequate.

The deficiencies of a single conversion tuner have become especially troublesome due to the increasing number of "contiguous" channels now available in large cable television systems. With the advent of digital television transmission systems, such as for high definition television (HDTV) the problem becomes still more difficult because these systems make full use of the available channel spectrum and only a small guard band of a few hundred kilohertz (KHz) exists between channels. In addition, the overall frequency response of a tuner for tuning digital television signals must be flat to the edges of the channel, but nevertheless, have a very steep "roll-off" (attenuation) at the edges for adequate adjacent channel rejection. This makes the design of an appropriate IF filter more complicated since no Nyquist slopes and sound traps, which tend to ease IF filter design, can be used in digital systems. In addition, it is contemplated that both analog and digital television signals will be transmitted during a transition period. In that case, even more adjacent channel selectivity will be required for good reception of the digital signals because digital television signals will be transmitted with much less power than analog television signals.

The "double-conversion" variation of the superheterodyne tuner was developed to overcome the shortcomings of the single-conversion tuner. In this type of tuner, a first conversion stage is followed by a first IF filter section, a second conversion stage, and a second IF filter stage. The first IF section has a very high frequency range, typically in the order of 620 MHz. The second IF section has a much lower frequency range, typically the same as that of the only IF filter section of a single conversion tuner. The second IF section is followed by a detection section.

The very high frequency of the first IF filter section places the RF signals corresponding to unwanted conversion responses such as the "image" response at frequencies readily rejected by tunable RF stages which precede the first conversion stage. The low frequency second IF provides the required adjacent channel selectivity needed for modern television reception. Unfortunately, an double-conversion tuner system requires additional RF and IF circuitry compared to a single conversion tuner, and much of the additional circuitry must function at relatively high frequencies requiring extensive shielding. As a result a double conversion tuner is relatively large in size and expensive.

Another type of tuner known as a "direct conversion" tuner has improved unwanted conversion product rejection and selectivity properties with respect the TRF and heterodyne types of tuners. A direct conversion tuner operates in accordance with a third tuning method in which the frequency of a local oscillator signal of a first frequency conversion stage is set in the middle of the frequency band of the desired channel. The product of the first conversion stage is at relatively low frequency. There are no image responses because the frequency of the first conversion stage is located with the spectrum of the desired RF signal. In addition, the very low frequency range of the signal produced at the output of the first conversion stage makes it possible to readily provide a filter which can reject adjacent channel signals.

Unfortunately, because the first local oscillator signal is centered in the frequency band of the desired channel, both the upper and lower side band of the desired channel will be converted to the frequency range of the first IF signal so that the lower side band (LSB) is in effect folded over onto the upper side band (USB) in the spectrum of the first IF signal. Since the LSB and USB occupy the same frequency range, the LSB and the USB must again be separated before detection. To accomplish this, a direct conversion tuner is arranged as is shown in FIG. 1.

Basically, the direct conversion tuner contains two channels, each with two conversion stages. The received RF signal is coupled to each of two mixers M1A and M1B via a tuned RF amplifier which provides gain and some selectivity. Desirably, the gain of the RF amplifier is automatically controlled in response to an automatic gain control (AGC) signal (not shown). The local oscillator signal generated by a first local oscillator LO1 is tuned to the center frequency too of the frequency band of the desired channel between the lower sided band (LSB) and the upper side band (USB), as is shown in FIG. 2a. The first local oscillator signal is split by a phase shifting circuit PS1 into quadrature components that are used to drive mixers M1A and M1B. The respective IF output signals of mixers M1A and M1B are filtered by two low pass filters LPF A and LPF B. Low pass filters LPF A and LPF B provide the necessary selectivity to reject the responses from the adjacent channels and higher order products of mixers M1A and M1B.

Each of the output signals of mixers M1A and M1B includes both a lower side band portion and an upper side band portion corresponding to the LSB and USB portions of the received RF signal. However, as earlier indicated, the LSB portion is folded over so that it is superimposed on the USB portion and occupies the same frequency range, as is shown in FIG. 2b. The output signal of low pass filters LPF A and LPF A are coupled to respective ones of a second pair of mixers M2A and M2B. Mixers M2A and M2B are driven by respective ones of a second pair of quadrature local oscillator signals generated by a second local oscillator LO2 and a second phase shifting circuit PS2. Each of the second local oscillator signals has a frequency $\omega_N$ located above the cutoff frequency of the low pass filters LPF A and LPF B filters to fulfill the Nyquist criteria. The output signals of mixers M2A and M2B are added in a summer unit SU to produce an output signal which has a spectrum which includes separated lower and upper side band portions, as shown if FIG. 2c. This output signal is coupled to a demodulator (not shown) which demodulates it, and the demodulated resultant is coupled to further signal processing sections.

The operation of the direct conversion tuner shown in FIG. 1 can be mathematically understood by considering a very simple case in which the received RF signal is assumed to include a sinusoidal upper side band component of sin $(\omega_0 + \omega_1)$ and a sinusoidal lower side band component of sin $(\omega_0 - \omega_2)$, as is indicated in FIG. 3a. It is also assumed that the gains and phase shifts of the two channels are identical. The phases of the signal components produced at various point of the direct conversion tuner are indicated by the vector arrows in FIG. 1. Further, the coefficients of the various mathematically factors corresponding to signal components have been normalized in the following description.

The quadrature first local oscillator signals applied to first mixers M1A and M1B are expressed as sin $\omega_0$ and cos $\omega_0$, respectively; and the quadrature second local oscillator signals applied to second mixers M2A and M2B are expressed as sin $\omega_N$ and cos $\omega_N$, respectively. The following signal is produced at the output of low pass filter LPF A:

$$\cos \omega_1 + \cos \omega_2$$

The following signal is produced at the output of low pass filter LPF B:

$$\sin \omega_1 - \sin \omega_2$$

The spectra at the outputs of low pass filters LPF A and LPF B are shown in FIG. 3b.

The result of the second mixing operation by mixer M2A produces the following output signal:

$$\sin (\omega_N + \omega_1) + \sin (\omega_N - \omega_1) + \sin (\omega_N + \omega_2) + \sin (\omega_N - \omega_2)$$

The result of the second mixing operation by mixer M2B produces the following output signal:

$$\sin (\omega_N + \omega_1) - \sin (\omega_N - \omega_1) - \sin (\omega_N + \omega_2) + \sin (\omega_N - \omega_2)$$

The addition of the two output signals of mixers M2A and M2B by summer SU results in the following signal:

$$\sin (\omega_N + \omega_1) + \sin (\omega_N - \omega_2)$$

The spectrum at the output of summer SU is shown in FIG. 3c.

The operation of the direct conversion tuner depends on the cancellation of unwanted components developed in the two channels (compare the output signals of mixers M2A and M2B indicated above including the terms sin $(\omega_N - \omega_1)$ and sin $(\omega_N + \omega_2)$). As was stated above, the description of the operation of the direct conversion tuner so far provided assumes that the gains and phase shifts of corresponding elements of the two channels are identical, resulting in perfect cancellation of the unwanted components after the addition of the output signals of the two channels by summer SU. However, in practice, gain and phase characteristics of the two channels are unequal and change with temperature and time. The gain and phase characteristics affect the phase and magnitude of the vectors shown in FIG. 1. As a result, perfect cancellation of the unwanted components no longer occurs causing the generation of unwanted spurious components in the output signal produced by summer SU and the reduction of the quality of the demodulated signal. This is especially the case when the received RF signal is relatively complex, such as a television signal, and does not simply contain a lower and an upper sinusoidal component as assumed in the above description.

The generation of unwanted spurious components when a television signal is tuned by a direct conversion tuner of the type shown in FIG. 1 is illustrated in FIGS. 4a, 4b and 4c. FIG. 4a shows the spectrum of a television signal of a single channel. It includes a picture carrier (PIX), a color subcarrier (SC) and a sound carrier (SOUND). The frequency, $\omega_0$, of the first local oscillator signal is located approximately midway between the picture carrier and the sound carrier. FIG. 4b shows the spectrum of the signal resulting from the first mixing operation. FIG. 4c shows the spectrum of the output signal of summer SU. For each desired component of the output signal of summer SU to the right of the frequency, $w_N$, of the second local oscillator signal, an undesired "companion" to the left exists; and for each desired component of output signal of summer SU to the left of frequency $\omega_N$ an undesired "companion" to the right exists. For instance, a "companion" of the picture carrier is present to the right of $\omega_N$ between the color subcarrier and the sound carrier. The presence of the unwanted "companions" causes annoying beat patterns in the demodulated video signal and may also adversely affect the demodulated sound signal. Such unwanted components should desirably be suppressed in the order of 45 to 50 dB for optimum performance of the television receiver. This means that the gain and phase errors should desirably be kept less than 0.05 dB. and 0.5 degrees, respectively, for optimum performance of the television receiver. Such performance standards cannot be obtained and maintained with manual adjustments.

SUMMARY OF THE INVENTION

The present invention concerns an arrangement for automatically reducing the gain and phase difference errors of the two channels of a direct conversion tuner in order to reduce the generation of unwanted components in the output signal. In accordance with an aspect of the invention, a multiple frequency reference signal is inserted as a test signal at respective insertion points of the two channels and signals produced at respective measurement points of the two channels are compared as to amplitude and phase to produce so called "ripple" gain and phase difference responses related to the gain and phase shift differences between two channels, for example, due to the IF low pass filters. In accordance with another aspect of the invention, the signals developed at the measurement points in response to the RF signal for the selected channel are also compared as to amplitude and phase to produce so called "DC" gain and phase difference values related to gain and phase shift differences of one or more of the conversion stages. The "ripple" gain and phase responses and the "DC" gain and phase difference values are used to control a gain and phase correction network so that the amplitude and phase differences between the measured signals of the two channels are reduced. Preferably, the arrangement is implemented in a digital embodiment in which analog-to digital converters are included in respective ones of the channels after the first conversion stages and the gain and phase correction units comprise digital filters after the second conversion stages. The operation of automatic gain and phase equalization arrangement can be automatically initiated each time the television receiver is switched on or a new channel is selected.

These and other aspects of the invention will be described with respect to the accompanying Drawings.

BRIEF DESCRIPTION OF THE DRAWING

In the Drawing, FIGS. 1, 2a–2c, 3a–3c and 4a–4c concern the background of the invention and have previously been described. Briefly:

FIGS. 3a, 3b and 3c are graphical representations of the spectra of signals at various points of the direct conversion tuner shown in FIG. 1 assuming that the input signal consists of two sinusoidal components; and FIGS. 4a, 4b and 4c are graphical representations of the spectra of signals at various points of the direct conversion tuner shown in FIG. 1 when the input signal comprises an analog television signal.

Figure 5:
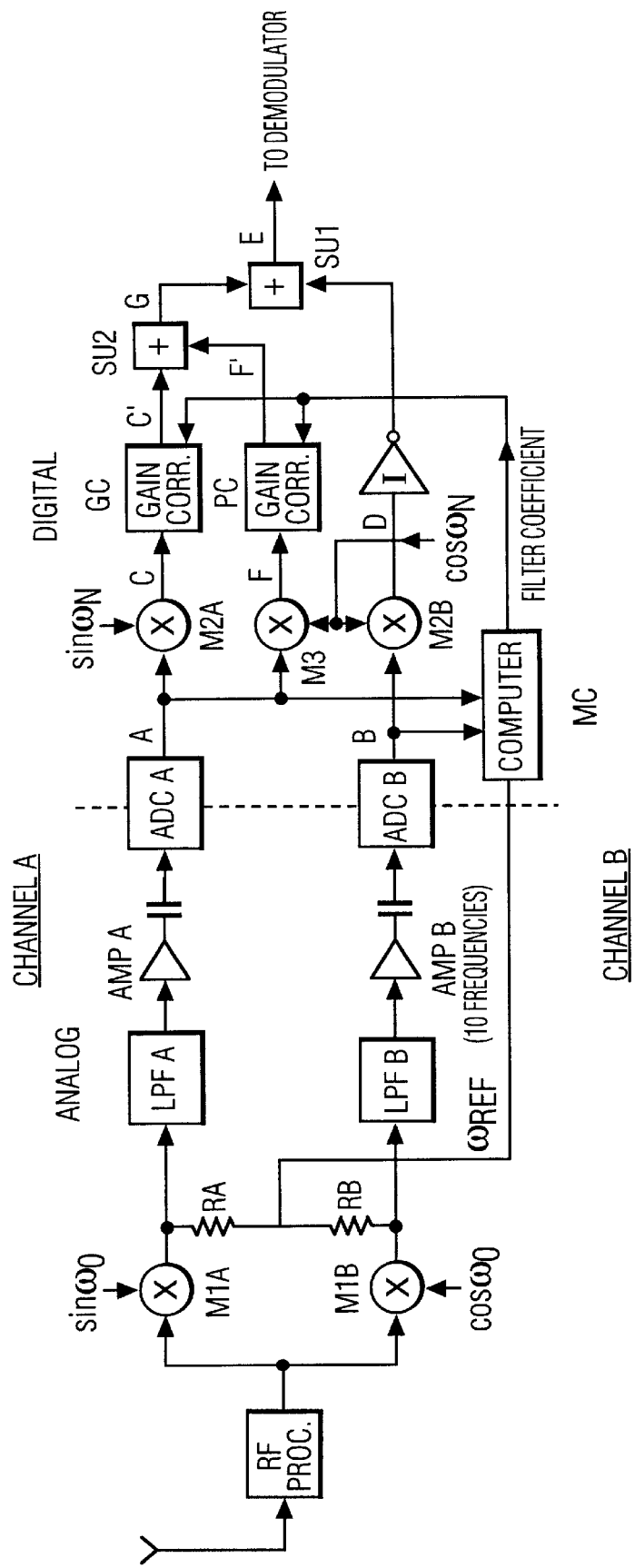
Figure 6:
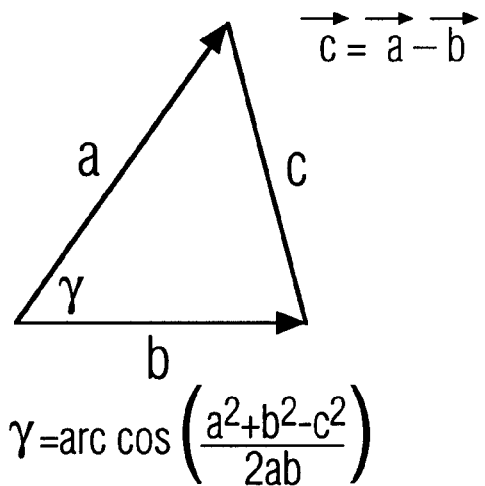
Figure 10:
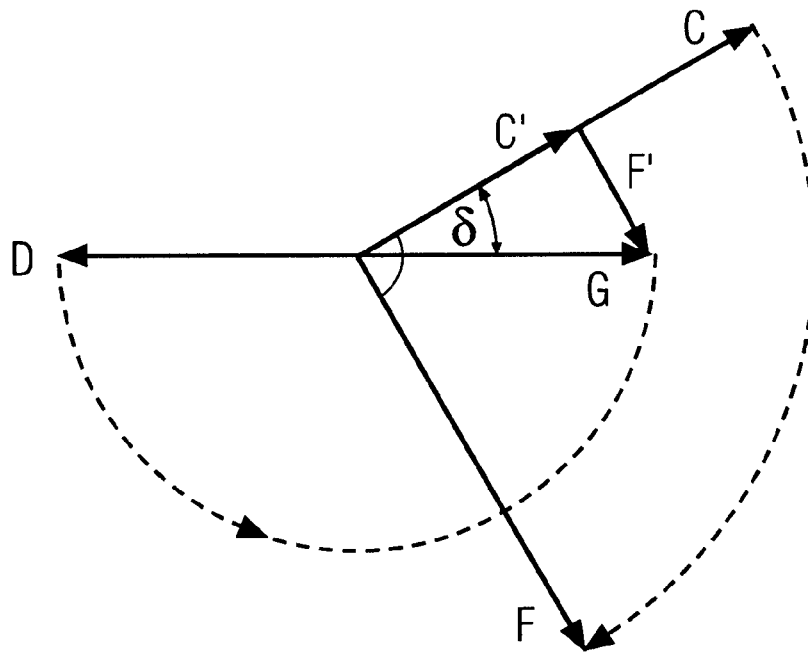
Figure 11A:
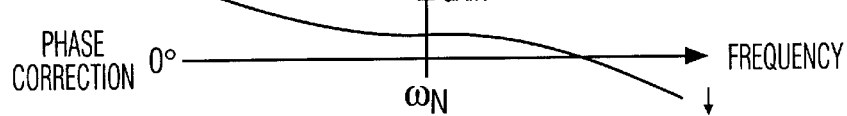
Figure 11B:
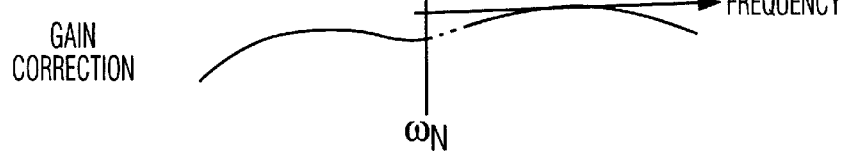
Figure 12:
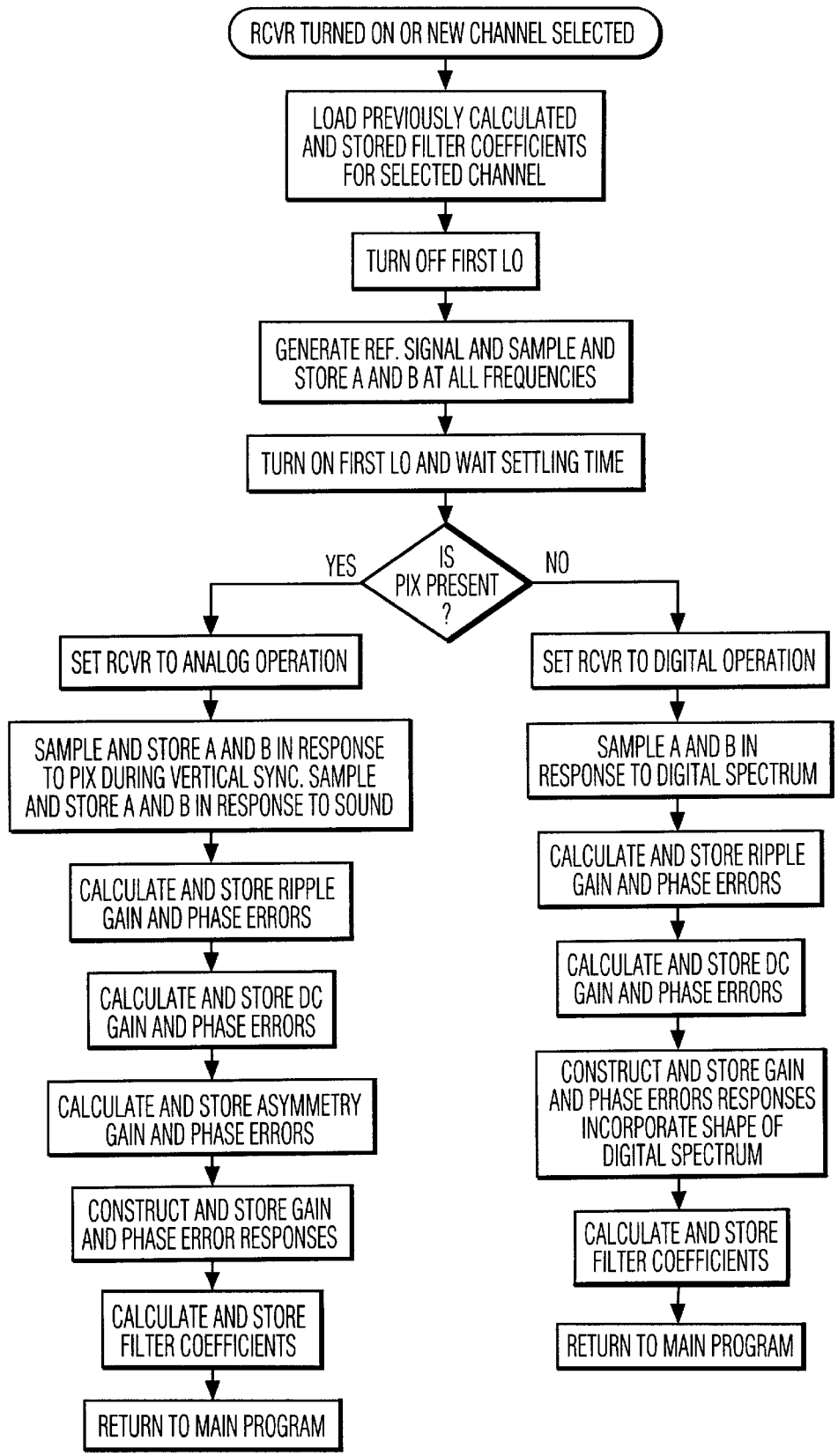

The remaining Figures of the Drawings concern the embodiment of the invention. Briefly:

FIG. 5 is a block diagram of a direct conversion tuner including an automatic gain and phase equalization arrangement constructed in accordance with an aspect of the invention;

FIG. 6 is a vector diagram useful in understanding how gain and phase errors are measured by the automatic gain and phase equalization arrangement;

FIGS. 7a and 7b, 8a and 8b, and 9a and 9b are graphical representations of spectra of phase and gain errors useful in understanding how phase and gain correction information used by the automatic gain and phase equalization arrangement is obtained;

FIG. 10 is a vector diagram also useful in understanding how phase and gain correction information used by the automatic gain and phase equalization arrangement is obtained;

FIGS. 11a and 11b are graphical representations of spectra of phase and gain correction responses needed for phase and gain equalization which result from the operations illustrated in FIGS. 7a and 7b, 8a and 8b, 9a and 9b and 10;

FIG. 12 is a flow chart indicating the overall operation of the automatic gain and phase equalization arrangement.

DETAILED DESCRIPTION OF THE DRAWING

Figure 1:
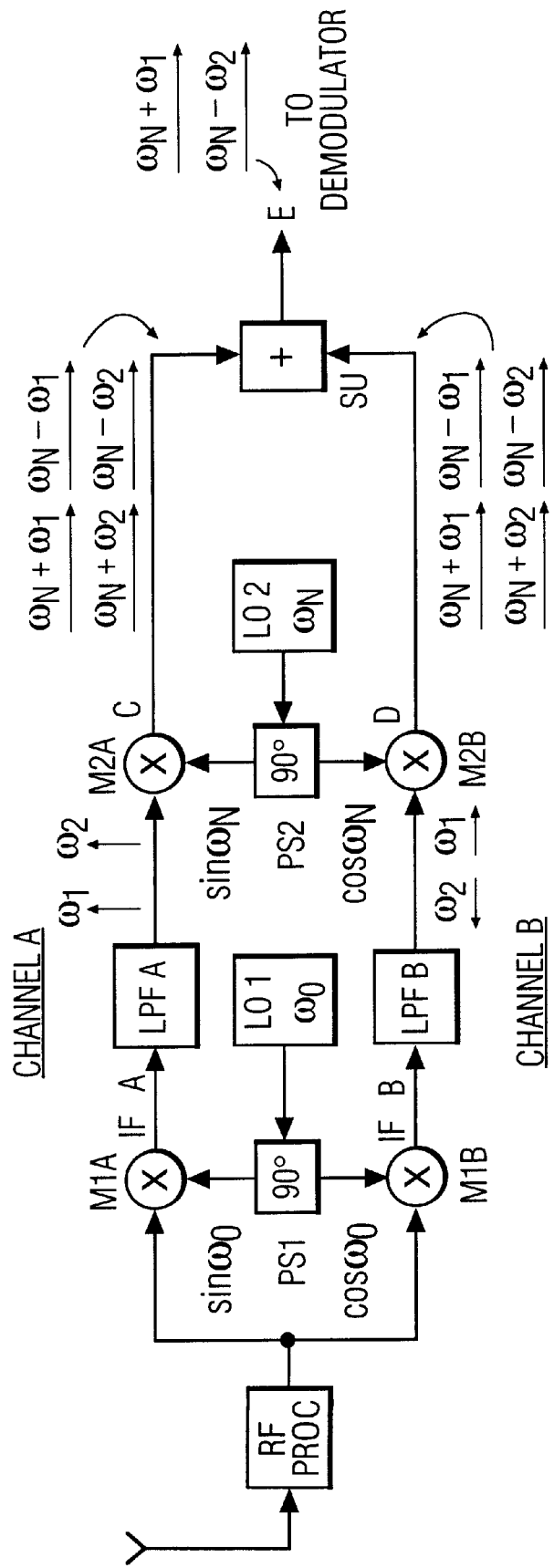
FIG. 1 is a block diagram of a direct conversion tuner as is known in the prior art.
Figure 2C:
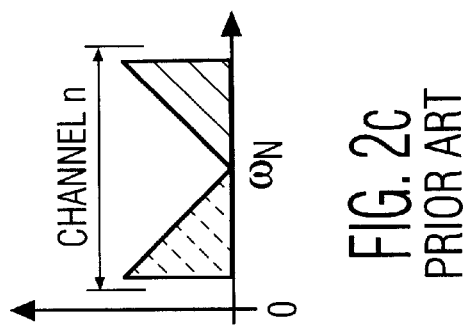
FIGS. 2a, 2b and 2c are graphical representations of the spectra of signals at various points of the direct conversion tuner shown in FIG. 1.
Figure 2B:
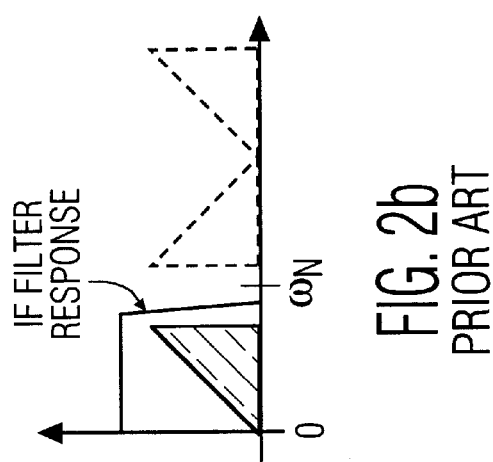
Figure 2A:
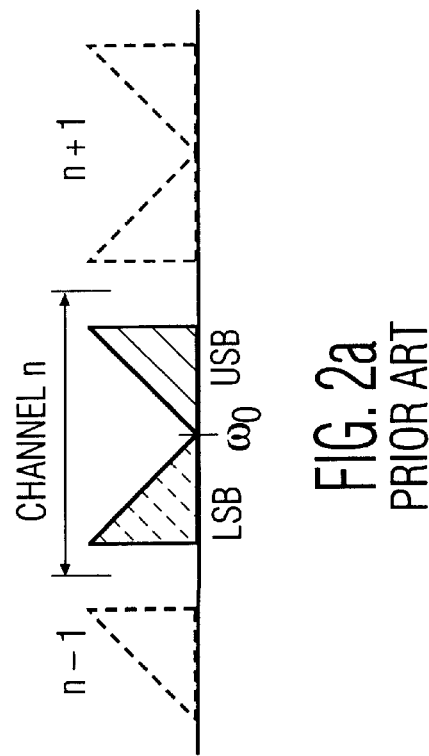

The direct conversion tuner shown in FIG. 5 is generally similar to the one shown in FIG. 1, but includes additional elements which comprise an automatic gain and phase equalization arrangement constructed in accordance with an aspect of the invention and certain related elements. Those elements of the direct conversion tuner shown in FIG. 5 which have the same or similar functions as corresponding elements of the direct conversion tuner shown in FIG. 1 are identified by the same or similar reference designations and will not be described in details again.

The automatic gain and phase equalization arrangement comprises a gain and phase correction network including a first gain control unit labeled GC and a second gain control unit which is actually used for phase correction and is therefore labeled PC. The gain and phase correction network is inserted in channel A between LPF A and output summer SU2. Gain correction unit GC and phase correction unit PC comprise respective programmable digital filters which are controlled by a microcomputer MC to adjust the gain and phase characteristics of channel A so that the gain of phase characteristics of the channels A and B are substantially identical. Gain correction unit GC and phase correction unit PC may, for example comprise, finite impulse response (FIR) filters. Microcomputer MC samples the signals developed at points A and B just before second mixers M2A and M2B in response to a test signal and determines the relative amplitudes and phases of the sampled signals to develop filter coefficient control signals for gain correction unit GC and phase correction unit PC. For this purpose, microcomputer MC generates a reference signal labeled $\omega_{REF}$ which is inserted as a test signal just after first mixers M1A and M1B, for example, via resistors RA and RB. Microcomputer MC also samples the signals developed at points A and B in response to the received RF signal for the selected channel and determines the relative amplitudes and phases of the sampled signals the to develop the filter coefficient control signals. The generation of the filter coefficient control signals will be described in detail below. Microcomputer may comprise the same microcomputer which is used to control other functions of the television receiver.

In the embodiment of invention shown in FIG. 5, the gain and phase correction is accomplished by the addition of two signals which are in quadrature phase relationship as will be described below in greater detail with respect to the vector diagram shown in FIG. 10. For this purpose gain correction unit GC and phase correction unit PC (which is actually another gain control unit) are included in separate paths for which the respective signals are in quadrature phase relationship. More specifically, gain correction unit GC receives a signal developed at a point C at the output of second mixer M2A while phase correction unit PC receives a signal developed at a point F at the output of an additional mixer M3. The same local oscillator signal which is coupled to second mixer M2B of channel B is coupled to additional mixer M3 so that oscillator signals coupled to mixers M2A and M3 have a quadrature phase relationship (sin $\omega_N$ and cos $\omega_N$, respectively). As a result, the signals developed at points C and F have a quadrature phase relationship. The output signal of gain control unit GC developed at a point C' is added to the output signal of phase correction unit PC developed at a point F' by an additional summer unit SU2. The signal produced at a point G at the output of additional summer unit SU2 is combined with to the signal produced at a point D at the output of a mixer M2B by a summer unit SU1 corresponding to summer unit SU of the direct conversion tuner shown in FIG. 1. The signal developed at a point E at the output of summer SU1 is coupled to a demodulator section (not shown).

Since the gain and phase equalization apparatus is implemented in digital form in the direct conversion tuner shown in FIG. 5, analog-to-digital converters ADC A and ADC B have been added to respective ones of channels A and B prior to the second conversion stages. The ADC A and ADC B receive amplified versions of the output signals of LPF A and LPF B from respective ones of amplifiers AMP A and AMP B and provide respective digital versions of the output signals of LPF A and LPF B. The outputs of amplifiers AMP A and AMP B are capacitively coupled to the inputs of the ADC A and ADC B via respective ones of capacitors CA and CB to avoid DC drift problems. The amplifiers may be omitted when the outputs signals of LPF A and LPF B have sufficient amplitudes to permit reliable analog-to-digital conversion. In the direct conversion tuner shown in FIG. 5, second mixers M2A and M2B comprise digital multipliers instead of analog mixers and summers SU1 and SU2 are digital adders.

Before describing the gain and phase equalization operation in detail it is helpful to describe the nature of the gain and phase errors. The gain and phase errors can be divided into "ripple" and "DC" errors. The "ripple" error is caused by the differences between the gain and phase responses of low pass filters LPF A and LPF B. It varies as a function of the IF frequency, but is constant for all received television channels. The "DC" error is caused by quadrature errors and gain differences between first mixers M1A and M2B. It is constant for a selected channel but varies with the frequency of the first local oscillator. Second mixers M2A and M2B do not introduce additional errors if they are implemented in digital form as is the case in the direct conversion tuner shown in FIG. 5.

There is an additional error which can be referred to as an "asymmetry" error which occurs when first mixers M1A and M1B are implemented as a doubly-balanced mixer. The use of a doubly-balanced mixer is desirable since it tends to reduce the coupling of the RF signal and local oscillator signal to the output of the mixer because of its balanced configuration. However, a doubly balanced mixer is not perfectly balanced and this results in slightly different gain and phase characteristics for RF signal components which have a frequency below the frequency, $\omega_0$, of the first local oscillator signal than for RF signal components which have a frequency above the frequency of the first local oscillator signal. The "asymmetry" error is small and can be neglected in most cases. However, it can be corrected, if desired, as will be described below.

It is possible to measure gain and phase errors with the use of a "sweep" generator which is connected to the antenna input, and which "sweeps" the frequency range of a selected channel. This method is relatively complicated and expensive. Measuring the ripple and DC errors separately is simpler.

The ripple error can be measured by using a multiple frequency reference signal, labeled $\omega_{REF}$ in FIG. 5. The reference signal has a low frequency range which only needs to be sufficiently broad to cover the IF frequency range. Experiments have shown that eight to ten discrete test frequencies are sufficient to obtain satisfactory results. The reference signal may be generated by an oscillator (not shown) under the control of microcomputer MC or directly by microcomputer MC by using a look-up table. During the ripple error test, the tuner has to be disabled from responding to the received RF signal. This may be accomplished by turning off the first local oscillator (LO1) or disabling the RF stage. The ripple errors can be measured each time the television is switched on or when a new channel is selected. Once the ripple errors have been measured, the normal operation of the tuner is again initiated.

The DC errors of mixers M1A and M1B are local oscillator or channel-dependent, but are otherwise constant over the frequency range of each channel. Therefore, the DC errors can be measured using a single frequency test signal for each selected channel. However, advantageously, the picture and sound carriers of the received television signal can be used to measure the DC errors. Both carriers are known in frequency and have high energy which makes the measurement reliable. Using both the picture and sound carriers allows for the correction of the asymmetry errors because, as shown in FIG. 4a, the frequency of the picture carrier is below the frequency, $\omega_0$, of the first local oscillator signal and the frequency of the sound carrier is above the frequency of the first local oscillator signal. The carriers are measured at points A and B at the outputs of ADC A and ADC B during the occurrence of the broad vertical equalizing pulses when the picture carrier has its highest energy but is not modulated with video information. However, because both picture and sound carriers are present, the carriers need to be separated. The separation can be accomplished after the measurement by microcomputer MC in accordance with a software filter program. For example, low pass and high pass filter responses can be obtained utilizing a MatLab™ program commercially available from MATHWORKS, Inc., of Massachusetts. The low and high pass filter responses can be used to separate the picture carrier and sound carrier responsive portions of the measurement values. Alternatively, microcomputer MC may comprise a digital signal processor (DSP) unit including digital filters and a microprocessor may advantageously be used. In that case, the digital filters can be used to separate the picture and sound carriers.

The phase error for a particular test can be calculated by considering the vectors "a" and "b" representing the digitized signals measured at points A and B and the vector "c" representing their differences as the three sides of a triangle, as is shown in FIG. 6, and by using the geometric cosine law to find the angle y between vectors "a" and "b". The gain error is the ratio of the magnitudes of vectors "a" and "b". This is valid only for RMS (root mean square) values so that a number of samples is required. More specifically, for each sample, the signal levels (A and B) at points A and B are measured and squared ($A^2$ and $B^2$) by microcomputer MC. In addition, for each sample, the difference between the signal levels (A–B) at points A and B is calculated and squared (($A-B)^2$). The squared values for all of the samples are added. The squared magnitude of third side "c" of the triangle is related to the sum of the squared values of the difference values ($\Sigma(A-B)^2$). The square root of the ratio of the sums of the squared signal values ($(\Sigma A^2/\Sigma B^2)^{1/2}$) is proportional to the relative gains of the two channels. The cosine law equation indicated in FIG. 6 is used to calculate the relative phase angle g from the appropriate sums of squared values. A relatively large number of samples, for example, in the order of 500 or more, because the magnitudes of the signals measured at points A and B are continuously changing, especially during the DC and asymmetry error -measurements when the measured signals are responsive to the carriers of the received RF signal. This method provides sufficient accuracy in an eight-bit environment.

The use of the cosine law in the above described manner does not result in reliable results for very small phase difference angles. The problem is solved in software by means of the addition of a phase shift to one of the signals measures at points A and B. The phase shift is latter subtracted from the calculated phase difference.

Figure 7A:
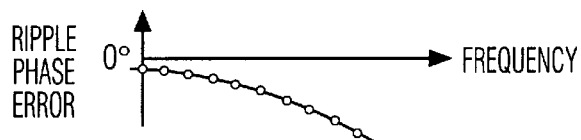
Figure 7B:
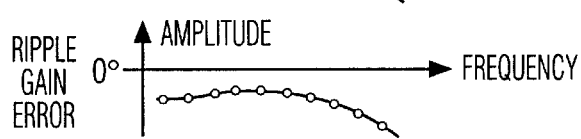
Figure 8A:
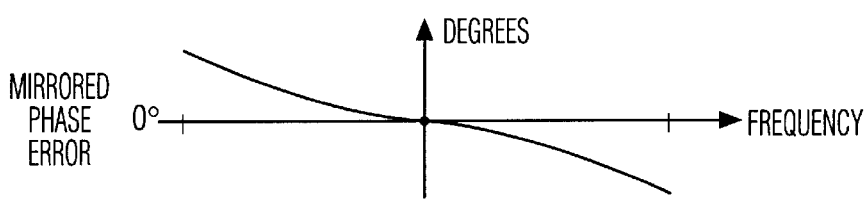
Figure 8B:
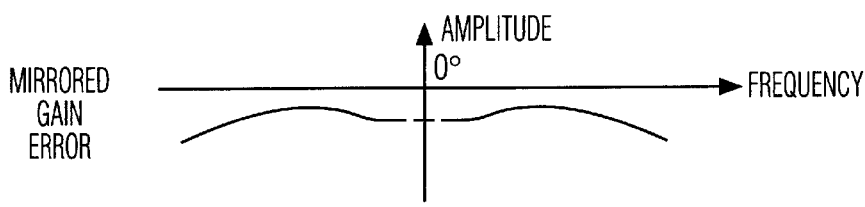

Once the gain and phase error values have been measured and stored in microcomputer MC, the necessary coefficients for the correction filters can be calculated. FIGS. 7a and 7b show examples of measured ripple phase and gain errors for one half of the received spectrum. The phase and gain errors for the other half of the spectrum are obtained by forming the mirror image of the existing phase error about the zero point and the mirror image of the existing gain error about the vertical axis. The resulting full spectra of the ripple phase and gain errors are shown in FIGS. 8a and 8b.

The ripple phase and gain error responses have to be combined with the DC phase and gain error responses. More specifically, the DC phase error is added to the ripple phase error response shown in FIG. 8a. The DC gain error is used to multiply the ripple gain error response shown in FIG. 8b.

If asymmetry errors exists, they can be compensated by using the asymmetry errors measured by using the picture and sound carriers, as earlier indicated. More specifically, the asymmetry phase error for the picture carrier is added to the left side of the ripple phase error response shown in FIG. 8a and the asymmetry phase error for the sound carrier is added to the right side. The asymmetry gain error for the picture carrier is used to multiply the left side of the ripple gain error response shown in FIG. 8b and the asymmetry gain error for the sound carrier is used to multiply the right side. As a result of the combination of the asymmetry errors with the ripple errors, a step in the middle of the responses may occur. In many cases the asymmetry errors are small and can be ignored, and therefore only the response to the picture carrier is needed. In the present example, it is assumed that the asymmetry errors are small, and therefor, have been ignored.

Figure 9A:
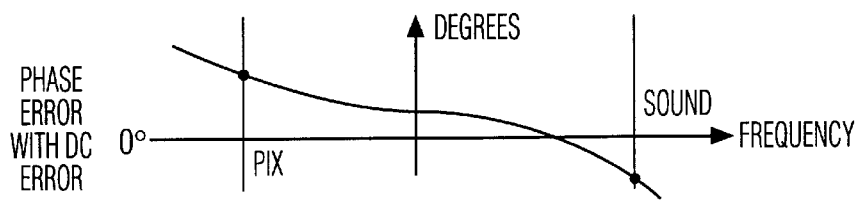
Figure 9B:
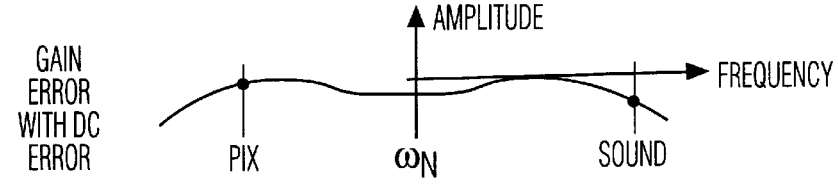

The final phase and gain error responses are shown in FIGS. 9a and 9b. The phase and gain error responses shown in FIGS. 9a and 9b cannot by themselves be used for calculating the error correction filter coefficients for gain correction unit GC and phase correction unit PC. Rather, the responses shown in FIGS. 9a and 9b have to be converted to the phase and gain correction responses shown in FIGS. 11a and 11b frequency point by frequency point. The manner in which this is accomplished is illustrated by the vector diagram shown in FIG. 10. In FIG. 10, the vectors correspond to signals developed at respectively labeled points of the direct conversion tuner shown in FIG. 5. With reference to FIG. 10, the phase (d) and gain errors at each frequency point of the response shown in FIGS. 9a and 9b are used to calculate a coefficient for changing the magnitude of vector C and coefficient for changing the magnitude of a quadrature vector F so that when the resultant vectors C' and F' are combined, vector G is formed which is equal in magnitude but opposite in phase to vector D, and therefor results in cancellation when added to vector D. The desired phase and gain correction compensation responses shown in FIGS. 11a and 11b correspond to the multiplication factors for vectors C and F required to produce vectors C' and F' for each sampled frequency on the frequency axis. The responses shown in FIGS. 11a and 11b are not symmetrical due to interaction between gain and phase.

The coefficients for phase correction unit PC and gain correction unit GC can be computed from the responses shown if FIGS. 11a and 11b using the MatLab™ FIR2 program. It should be noted that the coefficients for frequencies below second local oscillator frequency $\omega_N$ and the ones needed for frequencies above second local oscillator frequency $\omega_N$ correspond respectively to the opposite sides of the responses shown in FIGS. 11a and 11b because the inverse positional relationship between the desired components and the undesired components. This factor is easily incorporated in the hardware by inverting the signal developed at point D as is indicated by inverter I as shown in FIG. 5, or by subtracting the signal developed at point D from the signal developed at point G.

Once the filter coefficients for the selected channel have been calculated they are stored for retrieval whenever the same channel is again selected. As a result, the receiver is ready for reception when a new channel is selected without first calculating "new" filter coefficients. Temperature affects the drift of components, such as inductors and capacitors, in the IF filter and therefor affects the gain and phase error responses. However, it has been found that it is not necessary to perform the ripple gain and phase error measurements other than when the receiver is first turned on or perhaps when a new channel is initially selected. Accordingly, it is not necessary to interrupt the reception of a program. Measurement of the DC gain and phase errors is not a problem because the received television signal can be continuously monitored without affecting the normal operation of the tuner.

It has been found that the location of the frequency, $\omega_0$, of the first local oscillator signals within the spectrum of the RF signal can be used to optimize the operation of the direct conversion tuner. For example, the frequency of the first local oscillator signals should desirably between 1.7 and 2 MHz above the picture carrier (see FIG. 4a) for NTSC television signals, and between 2 and 2.8 MHz above the picture carrier for PAL television signals. The frequency of the first local oscillator signals can be set in accordance with the channel number, for example, by a phase locked loop tuning control system (sometimes called a "frequency synthesizer"). In that case, microcomputer MC may be used to control the frequency of the frequency determining programmable divider of the phase locked loop. An automatic fine tuning (AFT) arrangement responsive to the frequency of the picture carrier may be used to maintain the frequency of the first local oscillator signals at the desired frequency. The frequency of the picture carrier may be measured by microcomputer MC during the DC error measurement operation when the signals developed at points A and B are sampled.

The direct conversion tuner shown in FIG. 1 has been described so far with respect to tuning of analog television signals in which picture, sound and color subcarrier signals are modulated on RF carriers in accordance with a conventional television standard such as NTSC, PAL or SECAM. However the direct conversion tuner is also useful, and may in fact be even more useful, for tuning digital television signals, such as HDTV (high definition television) signals. As earlier noted, HDTV systems make full use of the available channel spectrum, have only a small guard band of a few hundred kilohertz (KHz) between channels, and require a tuner response which is flat to the channel edges but which is very steep at the edges for adequate adjacent channel rejection. A direct conversion tuner is particularly well suited to such a HDTV environment because it has a low IF frequency range which allows the use of simple and effective filters. An IF filter with a sharp "cutoff" and a large "stop-band" region is much easier to obtain at low frequencies than at the conventional IF frequencies (38 MHz and higher).

While the direct conversion tuner described so far is well suited for tuning digital television signals, certain modifications need to be incorporated because discrete carriers which can be used to measure the DC gain and phase errors are usually not transmitted in a digital television system. However, it has been found that the spectra of digital television signals, which are typically flat and have similarities to random noise, may be used to accurately measure the DC errors. The use of the spectra of the digital television signals to measure the DC errors may require more samples to be used than when picture or sound carriers are used. For example, samples taken over ten to twenty television lines may be required. In a direct conversion tuner for tuning digital television signals, the same method of measuring the ripple gain and phase errors using a plural frequency reference signal previously described with respect to the direct conversion tuner for tuning analog television signals is used.

Even if the spectra of the received digital television signals are not flat for a particular digital television system, the spectra can still be used to measure the DC gain and phase difference errors, provided that the shape of the spectra is to modify filter coefficients.

Digital television signals are more robust than analog television signals and therefore the generation of unwanted spurious frequency components is less critical. It is therefore not necessary to consider the small asymmetric errors and larger tolerances for gain and phase errors can be accepted.

In a television receiver which is capable of processing both analog television signals and digital television signals, a single direct conversion tuner may be used to tune both the analog and digital television signals. The flow chart shown in FIG. 12 summarizes the operation of the direct conversion tuner which has been previously described, and additionally indicates its operation in a dual mode television receiver. As is indicated in the flow chart, after the receiver has been energized or a desired channel is selected, the previously stored gain and phase equalization data for the selected channel is retrieved from memory and coupled to gain correction unit GC and phase correction unit PC, the ripple error measurements are made. Thereafter, the detection of the presence or absence of a picture carrier causes the selection of either an analog television signal branch or a digital television signal branch, respectively, of the program for measuring the DC errors and calculating the filter coefficients.

While the invention has been described in terms of as specific embodiment, it is contemplated that modifications will occur to those skilled in the art. For example while individual gain and phase correction units are utilized in the embodiment, a single digital filter may be provided to provide both gain correction and phase correction. Such a filter may be constructed in either FIR (finite impulse response) or IIR (infinite impulse response) form. In addition, while gain correction unit GC and phase correction unit PC are included in the same channel in the embodiment, one of the units may be included in one channel and the other may be included in the other channel. Further, while two analog-to-digital converter are utilized in the embodiment, it is possible to use a single ADC which is multiplexed to sample the signals developed at the measurement points of the two channels. Still further, while the use of the picture and sound carriers has been described with respect to the DC and asymmetry error measurements in a direct conversion tuner for tuning analog television signals, other components may also be utilized. For example, the color subcarrier may be used in place of sound carrier in the asymmetry error measurement. Even still further, while the reference signal is inserted after the first mixers in the embodiment, the reference signal can be inserted at other locations such as in the RF stage. In the same vain, while the measurement points of the embodiment are located before the second mixers because the second mixers are implemented in digital form, different measurement points, such as ones located after the second mixers, may be used. Moreover, while a direct conversion tuner including the automatic gain and phase equalization provisions which have been described is particularly well suited for tuning television signals, it is also useful for tuning other types of communications signals. These and other modifications are intended to be within the scope of the following claims.

I claim:

1. In a receiver, tuning apparatus for tuning a selected one of a plurality of RF signals received at an RF input to produce an output signal at an output, comprising:

first and second channels each having an input and an output and, in the order named, a first mixer stage, a filter stage and a second mixer stage coupled between said input and output;

said inputs of said first and second channels being coupled to said RF input;

a summing unit having first and second inputs and an output, said outputs of said first and second channels being coupled to respective inputs of said summing unit, and said output of said summing unit being coupled to the output of said tuning apparatus;

means for providing first local oscillator signals of the same frequency but of quadrature phases to respective ones of said first mixer stages; said frequency of said first local oscillator signals being located within the frequency spectrum of said selected RF signal;

means for providing second local oscillator signals of the same frequency but of quadrature phases to respective ones of said second mixer stages; said frequency of said second local oscillator signals being located above the passbands of the respective said filter stages;

means for monitoring first and second signals produced at respective points within said first and second channels;

means for adjusting the relative gain and the phase shift of said first and second channels prior to summing of said outputs of said first and second channels in said summing unit;

said gain and phase shift adjusting means comprising respective individual units and being included in the same one of said first and second channels;

means for automatically controlling said gain and phase shift adjusting means to reduce the differences between the relative amplitudes and the phases of said first and second channels in response to the relative amplitudes and phases of said first and second signals, wherein said gain adjusting means is coupled in cascade with an additional summing network between said second mixer and said output of said one channel; and said phase shift adjusting means comprises an additional mixer and an additional gain adjusting means coupled in cascade between said filter stage and said output of said one channel; said additional mixer receiving a signal having the same frequency as the frequency of said second local oscillator signal of said one channel but of quadrature phase.

2. In a receiver, tuning apparatus for tuning a selected one of a plurality of RF signals received at an RF input to produce an output signal at an output, comprising:

first and second channels each having an input and an output and, in the order named, a first mixer stage, a filter stage and a second mixer stage coupled between said input and output;

said inputs of said first and second channels being coupled to said RF input;

a summing unit having first and second inputs and an output, said outputs of said first and second channels being coupled to respective inputs of said summing unit, and said output of said summing unit being coupled to the output of said tuning apparatus;

means for providing first local oscillator signals of the same frequency but of quadrature phases to respective ones of said first mixer stages; said frequency of said first local oscillator signals being located within the frequency spectrum of said selected RF signal;

means for providing second local oscillator signals of the same frequency but of quadrature phases to respective ones of said second mixer stages; said frequency of said second local oscillator signals being located above the passbands of the respective said filter stages;

means for monitoring first and second signals produced at respective points within said first and second channels;

said means for monitoring said first and second signals including first and second analog-to-digital converters respectively;

said first and second digital-to-analog converters being coupled between respective ones of said filters and said second mixer stages of said first and second channels;

said second mixer stages of respective ones of said first and second channels being digital mixers;

means for adjusting the relative gain and the phase shift of said first and second channels prior to summing of said outputs of said first and second channels in said summing unit;

means for automatically controlling said gain and phase shift adjusting means to reduce the differences between the relative amplitudes and the phases of said first and second channels in response to the relative amplitudes and phases of said first and second signals;

said means for automatically controlling said gain and phase shift adjusting means including a microcontroller operating under program control and being coupled to said analog-to-digital converter, wherein said automatic controlling means includes means for generating a reference signal and inserting it into each of said first and second channels after respective ones of said first and second mixers.

3. Tuning apparatus for tuning to a selected one of a plurality of RF signals received at an RF input to produce an output signal at an output, comprising:

first and second channels each having an input and an output and, in the order named, a first mixer stage, a filter stage and a second mixer stage coupled between said input and output;

said inputs of said first and second channels being coupled to said RF input;

a summing unit having first and second inputs and an output, said outputs of said first and second channels being coupled to respective inputs of said summing unit, and said output of said summing unit being coupled to the output of said tuning apparatus;

means for providing first local oscillator signals of the same frequency but of quadrature phases to respective ones of said first mixer stages; said frequency of said first local oscillator signals being located within the frequency spectrum of said selected RF signal;

means for providing second local oscillator signals of the same frequency but of quadrature phases to respective ones of said second mixer stages; said frequency of said second local oscillator signals being located above the passbands of the respective said filter stages;

means for monitoring first and second signals produced at respective points within said first and second channels;

means for adjusting the relative gain and the phase shift of said first and second channels prior to summing of said outputs of said first and second channels in said summing unit; and control means coupled to said monitoring and adjusting means for inserting a reference signal into both channels for automatically controlling said gain and phase shift adjusting means to reduce the differences between the relative amplitudes and the phases of said first and second channels in response to the relative amplitudes and phases of said first and second signals.

4. The tuning apparatus recited in claim 3, wherein:

said reference signal has a plurality of frequencies; and said control means is responsive to said first and second signals as affected by said reference signal at each of said pluralities of said frequencies.

5. The tuning apparatus recited in claim 3, wherein:

said reference signal has a plurality of frequencies and said automatic controlling means is responsive to said first and second signals as affected by said reference signal at each one of said pluralities of said reference signal.

6. The tuning apparatus recited in claim 3, wherein:

said gain adjusting means is coupled in cascade with an additional summing unit between said second mixer stage and said output of said one channel;

said phase shift adjusting means comprises an additional mixer stage and an additional gain adjusting means coupled in cascade between said filter stage and said output of said one channel; and said additional mixer stage receives a signal having the same frequency as the frequency of said second local oscillator signal of said one channel but of quadrature phase.

* * * * *